(12) United States Patent
Kim et al.

(10) Patent No.: US 7,265,040 B2
(45) Date of Patent: Sep. 4, 2007

(54) CLEANING SOLUTION AND METHOD FOR SELECTIVELY REMOVING LAYER IN A SILICIDATION PROCESS

(75) Inventors: Sang-Yong Kim, Yongin-si (KR); Kun-Tack Lee, Suwon-Si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 188 days.

(21) Appl. No.: 10/728,517

(22) Filed: Dec. 5, 2003

(65) Prior Publication Data
US 2004/0115952 A1 Jun. 17, 2004

(30) Foreign Application Priority Data
Dec. 5, 2002 (KR) .................. 10-2002-0076961

(51) Int. Cl.
*H01L 21/4763* (2006.01)
(52) U.S. Cl. .................. 438/586; 438/664; 438/683; 438/738; 438/742; 438/754
(58) Field of Classification Search ............ 438/586, 438/649, 656, 664, 683, 755, 655, 738, 742, 438/754
See application file for complete search history.

(56) References Cited

U.S. PATENT DOCUMENTS

| | | | | |
|---|---|---|---|---|
| 4,453,306 A | * | 6/1984 | Lynch et al. | 438/301 |
| 5,665,646 A | * | 9/1997 | Kitano | 438/592 |
| 6,140,233 A | * | 10/2000 | Kwag et al. | 438/669 |
| 6,200,942 B1 | * | 3/2001 | Stols | 510/245 |
| 2002/0180055 A1 | * | 12/2002 | Takahashi et al. | 257/774 |
| 2003/0047539 A1 | * | 3/2003 | Ma et al. | 216/89 |
| 2004/0244823 A1 | * | 12/2004 | Kim et al. | 134/28 |
| 2005/0227496 A1 | * | 10/2005 | Park et al. | 438/745 |

FOREIGN PATENT DOCUMENTS

| | | |
|---|---|---|
| EP | 1 123 956 A1 | 8/2001 |
| JP | 359171126 A * | 9/1984 |
| JP | 359202638 A * | 11/1984 |
| JP | 10-265974 | 10/1998 |
| JP | 00133635 | 12/2000 |
| KR | 95032597 | 12/1995 |

OTHER PUBLICATIONS

English Translation of Detailed Description—JP 2000-133635.*
"Making Ion Implanted Self Aligned FET Using Silicide Metallurgy," IBM Technical Disclosure Bulletin, vol. 14, Issue No. 12, May 1, 1972, pp. 3687-3688.*
English Abstract****.

* cited by examiner

*Primary Examiner*—M. Wilczewski
*Assistant Examiner*—Toniae M. Thomas
(74) *Attorney, Agent, or Firm*—F. Chau & Associates, LLC

(57) ABSTRACT

A cleaning solution selectively removes a titanium nitride layer and a non-reacting metal layer. The cleaning solution includes an acid solution and an oxidation agent with iodine. The cleaning solution also effectively removes a photoresist layer and organic materials. Moreover, the cleaning solution can be employed in tungsten gate electrode technologies that have been spotlighted because of the capability to improve device operation characteristics.

30 Claims, 7 Drawing Sheets

CLEANING SOLUTION AND METHOD FOR SELECTIVELY REMOVING LAYER IN A SILICIDATION PROCESS

FIELD OF THE INVENTION

The present invention generally relates to a method of removing undesirable layers in semiconductor devices, and more specifically to a solution and method of removing undesirable layers that are formed in a silicidation process.

BACKGROUND OF THE INVENTION

A conventional semiconductor manufacturing process includes forming an insulation layer and a conductive layer on a substrate, a photolithographic process, etc. The photolithographic process comprises forming a photoresist pattern on an underlying layer to be patterned, etching the layer exposed by the photoresist pattern, and then removing the photoresist pattern. In addition, organic materials or polymer may occur from the reaction between the underlying layer to be etched and an etching gas. Conventionally, the photoresist pattern and organic materials or the polymer are removed by an oxygen plasma ashing and a sulfuric strip process.

Operation speed of the devices has a close relationship with the resistances of the source/drain regions. Therefore, to increase the operation speed of a device, a metal silicidation process is used for forming semiconductor devices. The silicidation process comprises forming a cobalt silicide layer having resistivity lower than that of silicon from a reaction between cobalt and silicon at a predetermined temperature. In the silicidation process, non-reacting cobalt should be removed without removing the cobalt silicide layer.

Moreover, in a conventional cobalt silicidation process, a titanium nitride layer is formed so as to prevent oxidation of cobalt and agglomeration of the silicide layer in the silicidation process. Therefore, a titanium nitride layer should be removed after formation of the silicide layer.

If the layers are not removed, the layers can serve as contaminant sources and can cause electric short with neighboring conductors.

Conventionally, in the silicidation process, the non-reacting metal layers and the titanium nitride layers are removed by a mixture solution including peroxide ($H_2O_2$), i.e., a strong oxidation agent.

Meanwhile, as the semiconductor devices are highly integrated in an economic point of view, a conventional polysilicon gate electrode cannot satisfy the needs of the proper operation speed and the characteristic of a sheet resistance of the gate electrode. Therefore, a metal layer such as a tungsten layer, which has resistivity lower than a polysilicon layer, is stacked on the polysilicon gate electrode to form a metal gate electrode. Therefore, the low resistivity tungsten gate should also not be etched (or removed). In addition, a metal interconnection with tungsten (e.g., a word line or a bit line) should not be etched by the cleaning solution.

On the contrary, the peroxide, which is conventionally used in the silicidation process, etches the tungsten. Thus, the high-speed devices cannot be embodied using the conventional peroxide.

Accordingly, as the need of high-speed devices increases, the need for a new cleaning solution that can selectively remove metal layers such as a titanium nitride layer and a cobalt layer without removing metal layers such a cobalt silicide layer or a tungsten layer also increases.

SUMMARY OF THE INVENTION

One aspect of the present invention is to provide a cleaning solution that selectively removes a titanium nitride layer and a non-reacting metal layer in a silicidation process and a method of removing the titanium nitride layer and the non-reacting metal layer using the same.

It is another aspect of the present invention to provide a cleaning solution that selectively removes the titanium nitride and the non-reacting metal layer without removing tungsten and silicide layers in a silicidation process applying a tungsten gate process, and a method of removing the layers using the same.

It is further another aspect of the present invention to provide a cleaning solution that selectively removes metal layers and also removes a photoresist layer and organic materials in the silicidation process and a method of removing the layers using the same.

According to at least one embodiment of the present invention, the cleaning solution includes an acid solution and an oxidation agent containing iodine. The cleaning solution may further include water. This is for increasing a degree of dissociation of the acid solution and an oxidation agent containing iodine. Thus, the cleaning capacity of the oxidation agent and the acid solution is improved. In the exemplary embodiment, the cleaning solution contains water in an amount of about 30 wt % and less and the oxidation agent containing iodine in an amount of 0.003 to 10 wt %. The acid solution may include sulfuric acid, phosphoric acid and a mixture thereof. The oxidation agent containing iodine includes one or more iodates such as $KIO_3$, $NH_4IO_3$, $LiIO_3$, $CaIO_3$, and $BaIO_3$. If the cleaning solution includes water, the oxidation agent containing iodine may further include $K_I$, $NH_4I$ or a mixture thereof besides the iodate. That is, the oxidation agent containing iodine includes at least one selected from the group consisting of $KIO_3$, $NH_4IO_3$, $LiIO_3$, $CaIO_3$, $BaIO_3$, KI, and $NH_4I$. If the sulfuric acid is used as the acid solution, the concentration of the sulfuric acid may be about 96% or more.

The acid solution and the oxidation agent containing iodine effectively remove a titanium nitride and cobalt and also remove a photoresist layer and organic materials. On the contrary, the acid solution and the oxidation agent containing iodine do not etch a cobalt silicide layer and tungsten. The oxidation agent containing iodine reacts with silicon of a metal silicide layer and forms a silicon oxide (SiOx) layer thereon as a passivation layer. The silicon oxide layer has very strong acid proof to the sulfuric acid. Therefore, the metal silicide layer is protected. In addition, the oxidation agent containing iodine reacts with tungsten and forms a passivation layer such as a tungsten trioxide ($WO_3$) thereon. The tungsten trioxide passivation layer is a very stable layer in an acid solution. Therefore, tungsten is prevented from corrosion.

The cleaning capacity of the cleaning solution is proportional to temperature. For example, the cleaning may be carried out at a temperature range of about room temperature to about 120° C. The cleaning capacity of the cleaning solution is also proportional to the amount of the water that is added. The amount of water that is added to the cleaning solution is about 30 wt % and less.

A method of selectively removing a metal layer according to an embodiment of the invention comprises the following steps. A transistor is formed on a silicon substrate. The transistor comprises source/drain regions and a gate electrode. A metal layer that forms the silicide layer is formed over the exposed substrate. A titanium nitride layer is formed over the metal layer. A silicidation thermal process is carried out so as to react silicon with the metal layer. That is, the silicon of the exposed source/drain region and the metal layer that directly contacts therewith react with each other to form a metal silicide layer. Using a cleaning solution, a non-reacting metal layer that does not participate in the silicidation reaction and the titanium nitride layer are removed. In this case, the cleaning solution includes an acid solution and an oxidation agent containing iodine. Preferably, the cleaning solution further includes water. The cleaning solution may include water in an amount about 30 wt % and less, and the oxidation agent containing iodine in an amount about 0.003 to 10 wt %.

An exemplary embodiment of a method of forming the transistor comprises the following steps.

A gate insulation layer, a polysilicon layer, a tungsten layer and a capping insulation layer are sequentially formed on the silicon substrate. A photoresist pattern is formed over the capping nitride layer, and using the photoresist pattern as an etch mask, the layers formed thereunder are successively etched to form the gate electrode. Then, the photoresist pattern is removed. The source/drain regions are formed in the silicon substrate at both sides of the gate electrode by performing an ion implantation process, and nitride spacers are formed on sidewalls of the gate electrode. In this case, the photoresist pattern may be removed using the cleaning solution. The metal layer includes at least one of cobalt, titanium, and nickel.

According to the above method, the cleaning solution does not etch a metal silicide layer and tungsten that composes a low resistive gate electrode but selectively etches a titanium nitride layer and a non-reacting metal layer. Therefore, a silicidation process and a tungsten metal gate process can be employed all together.

An embodiment of a method of forming the transistor may comprise the following steps. A gate insulation layer and a polysilicon layer are sequentially formed over the silicon substrate. A photoresist pattern is formed over the polysilicon layer, and the gate electrode is formed by a successive etching of the layers formed thereunder using the photoresist pattern as an etch mask. Then, the photoresist pattern is removed. The source/drain regions are formed in the silicon substrate at both sides of the gate electrode by performing an ion implantation process. Nitride spacers are formed on the sidewalls of the gate electrode. When the metal silicide layer is formed in the source/drain regions by a silicide thermal treatment, a metal silicide layer is also formed on the polysilicon at an upper part of the gate electrode. Thus, the present invention is applicable to CMOS transistors, which use a dual poly silicon gate. The dual poly silicon gate is formed by implanting p-type impurities into PMOS and n-type impurities into NMOS. In this case, the photoresist pattern may be removed using the cleaning solution.

BRIEF DESCRIPTION OF THE DRAWINGS

Other aspects and features of the present invention will become apparent form the following detailed description taken in conjunction with the accompanying drawings that disclose embodiments of the invention. It is to be understood, however, that the drawings are designed for the purpose of illustration only and are not intended as a definition of the limits of the invention.

DETAILED DESCRIPTION OF PREFERRED EMBODIMENTS

Figure 1:
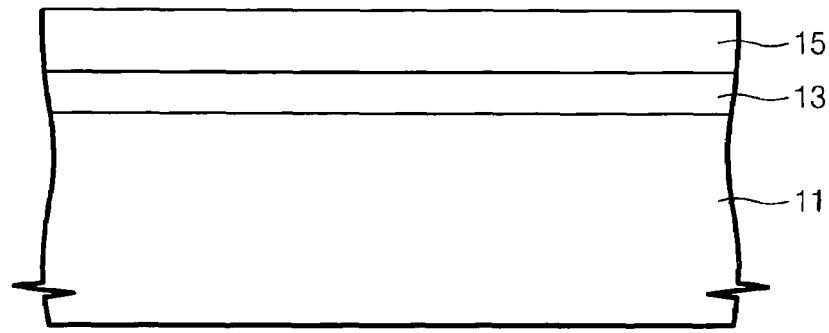
FIG. 1 is a schematic cross-sectional view of a substrate with a tungsten layer and a titanium nitride layer, a cobalt layer, or a photoresist layer that can be selectively removed according to an embodiment of the present invention.

The present invention will be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present.

FIG. 1 schematically illustrates a substrate 11 with a layer 13 that should not be etched (or removed) and a layer 15 that is formed thereon and should be selectively etched (or removed). The layer 13 that should not be etched is any of the layers that are not etched by the cleaning solution of the present invention. For example, the layer 13 includes tungsten or metal silicide. Meanwhile, the layer 15 includes for example, titanium nitride, cobalt, organic material, or photoresist material.

Intermediate layers may be further interposed between the substrate 11 and the non-etched layer 13, and between the non-etched layer 13 and the etched layer 15.

Figure 2:
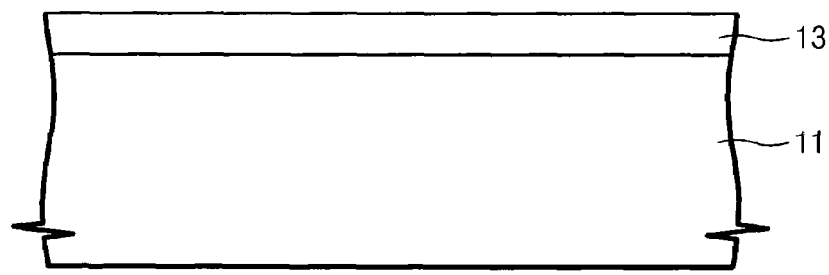
FIG. 2 is a schematic cross-sectional view of a resultant structure of a substrate without a titanium nitride layer, a cobalt layer or a photoresist layer that are selectively removed from the substrate of FIG. 2.

Referring to FIG. 2, using the cleaning solution according to an embodiment of the present invention, only the layer 15 that should be etched is selectively etched at a proper temperature. The cleaning solution includes an acid solution and an oxidizing agent containing iodine (I). Sulfuric acid, phosphoric acid, a mixture thereof, etc. can be used as the acid solution. The oxidizing agent containing iodine includes at least one selected from the group consisting of $KIO_3$, $NH_4IO_3$, $LiIO_3$, $CaIO_3$, $BaIO_3$, $KI$, $NH_4I$, etc.

The cleaning solution may further include water so as to improve the cleaning capacity of the acid solution and the oxidation agent containing iodine. Water increases the degree of dissociation of the acid solution and the oxidation agent containing iodine. Therefore, the added water is proportional to the cleaning capacity of the cleaning solution. The cleaning solution may include water of about 30 wt % and less. The cleaning solution may include the oxidation agent containing iodine of about 0.003 to 10 wt %.

The cleaning time is inversely proportional to temperature. That is, the cleaning capacity is proportional to the temperature. The cleaning may be performed at about room temperature to about 120° C. However, depending on the processing, the processing condition can be changed and this will be apparent to those skilled in the art.

FIGS. 3 through 6 are cross-sectional views showing steps of selectively removing undesired layers in a silicidation process of the fabricating process of the semiconductors.

Figure 3:
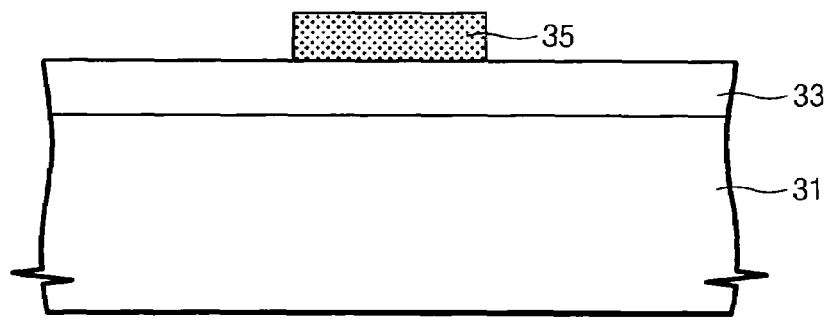
FIGS. 3 through 6 are cross-sectional views showing steps of selectively removing metal layers using an embodiment of a cleaning solution of the present invention.

As illustrated in FIG. 3, a substrate 31 is provided that includes a conductive pattern 35 comprising silicon. A layer 33 not comprising silicon is further interposed between the silicon pattern 35 and the substrate 31. The conductive pattern 35 comprising silicon is formed to have any shape on a surface of the layer 33 not comprising silicon. The conductive pattern 35 may be formed inside the layer 33. In case the conductive pattern 35 is formed inside the layer 33, the silicon conductive pattern 35 may be exposed only at the top surface thereof. In addition, another layer, for example, an insulation layer may be further formed on both sidewalls of the silicon conductive pattern 35. In this case, the silicon conductive pattern 35 may be exposed only at the top surface thereof. In any of the cases, the exposed silicon conductive pattern 35 and a metal layer that directly contacts thereon react with each other and form a silicide layer. Then, the formed silicide layer will be electrically connected by interconnections in a subsequent process.

Figure 4:
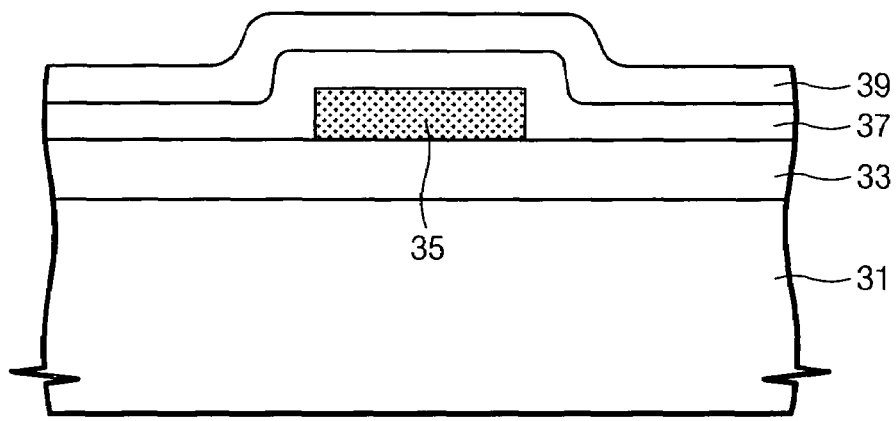

Referring to FIG. 4, a metal layer 37 and a titanium nitride layer 39 are sequentially formed on the layer 33 not comprising silicon so as to cover the silicon conductive pattern 35. The metal layer 37 may be formed of cobalt, titanium, nickel or the like.

Figure 5:
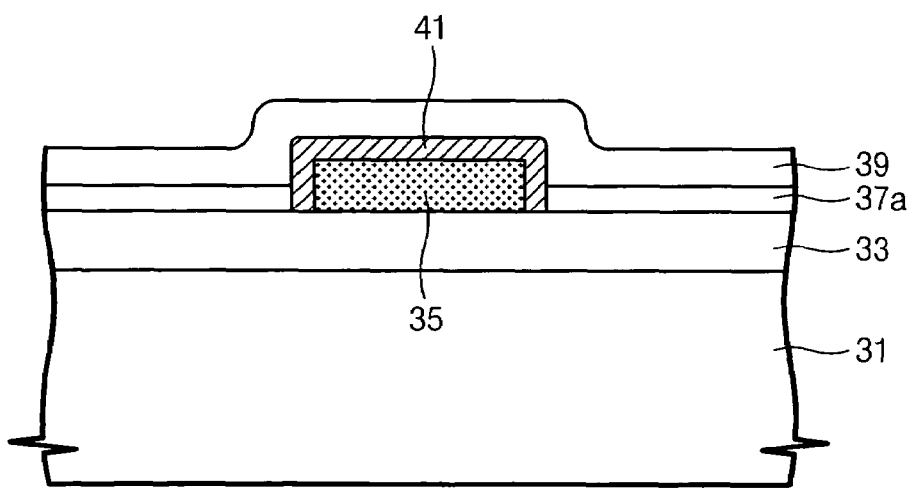

Referring to FIG. 5, a metal silicide layer 41 is formed on the exposed silicon conductive pattern 35 by performing a silicide thermal treatment. In this case, a metal layer 37a, which is formed on the layer 33 not comprising silicon, may not respond to the silicidation reaction.

Figure 6:
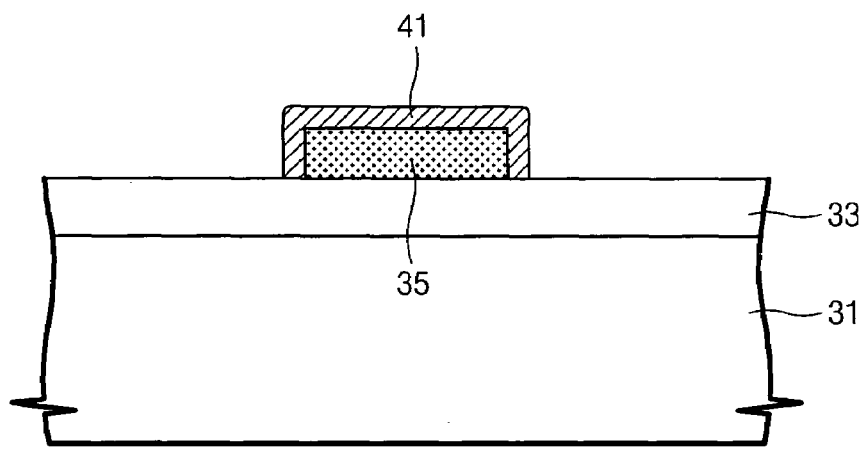

The titanium nitride 39 and the non-reacting metal layer 37a are removed by the cleaning solution. Therefore, as illustrated in FIG. 6, a conductive pattern 35 with the metal silicide 41 thereon is completed.

The cleaning solution is a mixed solution including acid solution and an oxidation agent containing iodine. In this exemplary embodiment, the cleaning solution further includes water. The cleaning solution may include water in an amount of about 30 wt % and less. In addition, the cleaning solution may include the oxidation agent containing iodine in an amount of about 0.003 to about 10 wt %. The cleaning time is inversely proportional to a temperature, That is, the cleaning capacity is proportional to the temperature. The cleaning process may be carried out at about room temperature to about 120° C.

The layer 33 not comprising silicon may further include a tungsten pattern. The cleaning solution reacts with the tungsten pattern to form a thin tungsten trioxide ($WO_3$) layer on the surface thereof as a passivation layer, thereby protecting the tungsten pattern. In addition, the cleaning solution reacts with the metal silicide layer 41 and forms a thin silicon oxide layer (SiOx) on the surface thereof as a passivation layer, thereby protecting the metal silicide.

After removing the titanium nitride layer 39 and the non-reacting metal layer 37a, an insulation layer (not shown) is stacked and then patterned to form an opening that exposes a predetermined part of the metal silicide layer 41. Then, the opening is filled with conductive material such as a metal to form a metal conductive pattern (or a conductive plug) that is electrically connected to the silicon conductive pattern 35.

A silicide layer is interposed between the silicon conductive pattern 35 and the metal conductive pattern (or a conductive plug), thereby improving a contact resistive characteristic or a resistive characteristic of the silicon conductive pattern 35.

Referring to FIGS. 7 through 12, a method of removing the undesired layer will be explained in accordance with an exemplary embodiment.

FIGS. 7 through 12 are cross-sectional views showing steps of removing the undesired layer by the cleaning solution of the present invention in a silicidation process in accordance with an exemplary embodiment. For clarity and simplicity, only one transistor is illustrated in the drawings.

Figure 7:
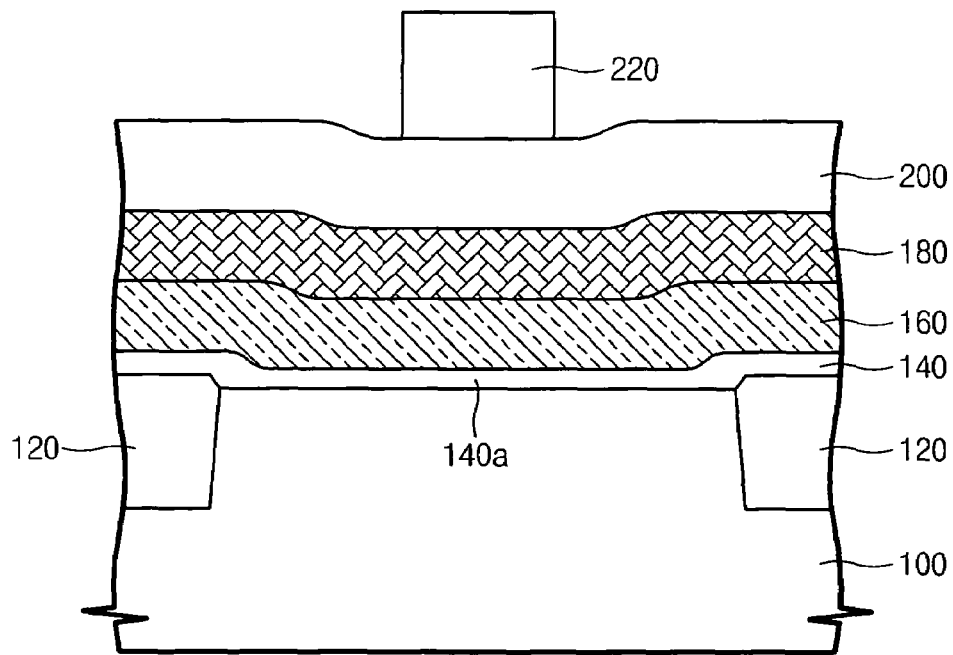
FIGS. 7 through 12 are cross-sectional views showing steps of selectively removing metal layers using a cleaning solution of the present invention in a silicidation process according to an exemplary embodiment.

Referring to FIG. 7, a well is formed in a silicon substrate 100 by doping of impurities. A device isolation process is performed to form device isolation layers 120 and then channel ions are implanted. The detailed explanation of the device isolation process will be omitted because the process is conventional and well known. Continuously, a gate insulation layer 140, a poly silicon layer 160, a tungsten layer 180, and a capping nitride layer 200 are sequentially formed. A conductive barrier layer may be further formed between the tungsten layer 180 and the polysilicon layer 160. The tungsten layer 180 speeds up the operation of the device. The conductive barrier layer prevents the reaction between the tungsten layer and the polysilicon layer.

Figure 8:
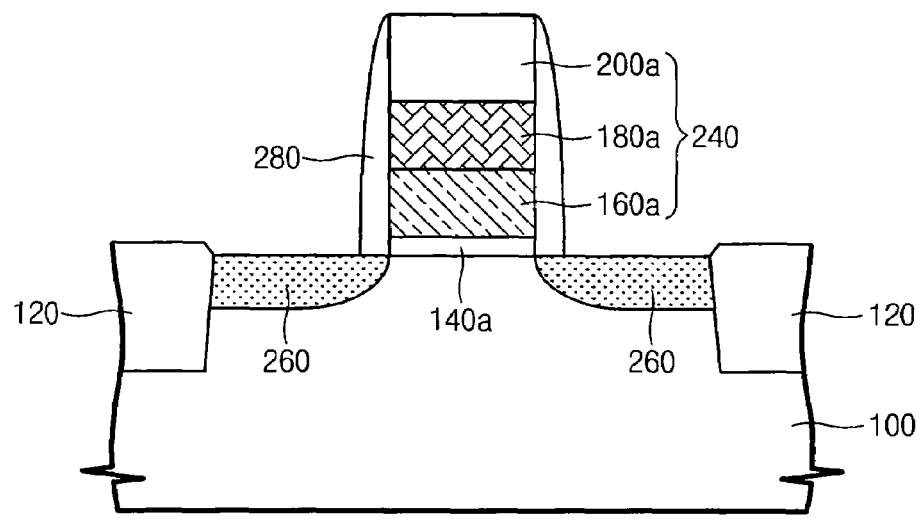

A photoresist pattern 220 is formed that defines a gate electrode on the capping nitride layer 200. The underlying layers exposed by the photoresist pattern 220 are etched to form a gate electrode 240 that corresponds to the photoresist pattern 220 as illustrated in FIG. 8. After the photoresist pattern 220 is removed, ions are implanted to form impurity diffusion layers 260 in the substrate 100 at both sides of the gate electrode 240. The implanted ions have a conductivity type opposite to the silicon substrate 100. For example, if the silicon substrate 100 is p-type, the implanted ions are n-type. The impurity diffusion layers 260 correspond to source/drain regions. The photoresist pattern 220 may be removed in the manner that is well known to those skilled in the art, for example, by an oxygen plasma ashing and a sulfuric acid strip process. In addition, the photoresist pattern 22 may be removed using the cleaning solution of the present invention. The cleaning solution will be explained.

Nitride spacers 280 are formed on both sidewalls of the gate electrode 240. That is, a silicon nitride layer is formed and then etched back to form the nitride spacers 280.

Figure 9:
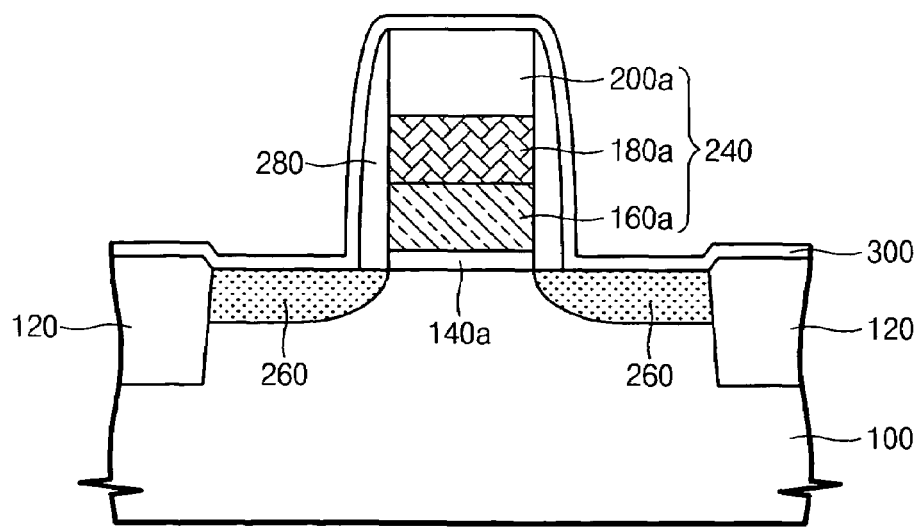

Referring to FIG. 9, after a pre-cleaning is performed, a cobalt layer 300 is formed so as to form a silicide layer. The pre-cleaning is carried out to remove a native oxide layer of the silicon substrate 100 and a damaged layer of the silicon substrate 100. For example, the pre-cleaning process may be performed in a two-step treatment.

That is, a first treatment is done using a mixture of $NH_4OH$ and $H_2O_2$ and a second treatment is continuously carried out using fluoric acid (HF), such as to cure the native oxide layer and the substrate. Meanwhile, the cleaning process may comprise a first treatment using a mixture gas of CF4 and O2 and a second treatment using HF.

A titanium layer or a nickel layer may replace the cobalt layer 300. The cobalt layer 300 may be formed by any method that is well known to those skilled in the art, for example, a sputtering method.

Figure 10:
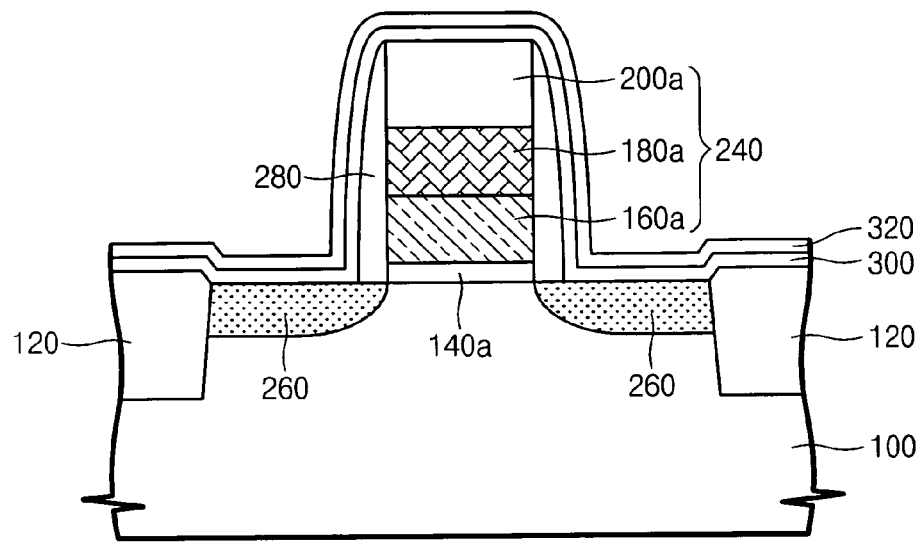

Referring to FIG. 10, a titanium nitride 320 is formed on the cobalt layer 300. The titanium nitride 320 may be formed by any method that is well known to those skilled in the art, such as a sputtering method. The titanium nitride layer 320 is formed to prevent oxidation of the cobalt layer 300 and to prevent agglomeration of the silicide layer.

Figure 11:
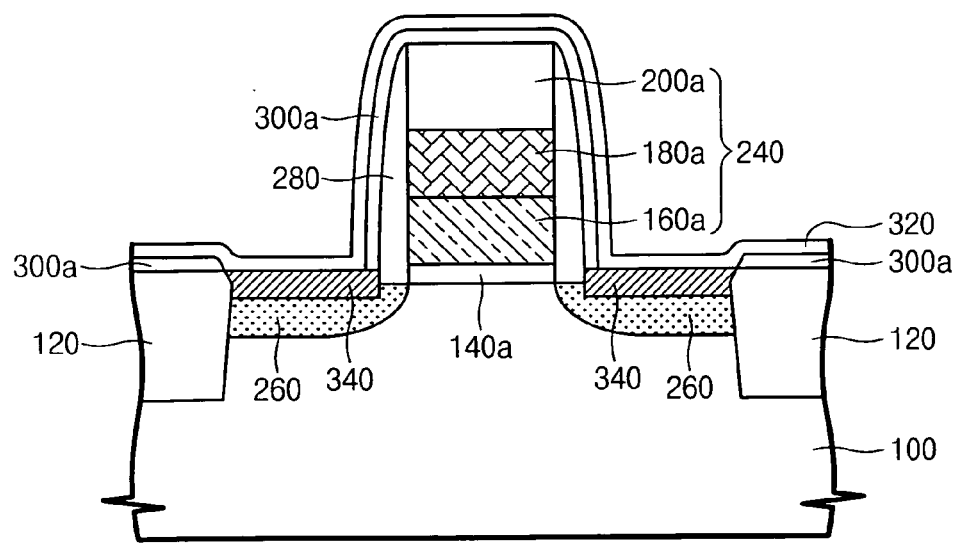

Referring to FIG. 11, a silicidation thermal process is performed to react the cobalt layer 300 with silicon of the silicon substrate directly underlying the cobalt layer 300 (i.e., source/drain regions 260). Thus, a cobalt silicide layer ($CoSi_2$) 340 is formed. As a result, the cobalt layer 300a of regions other than the source/drain regions 260 remain without reaction because there is no direct contact with the silicon.

Figure 12:
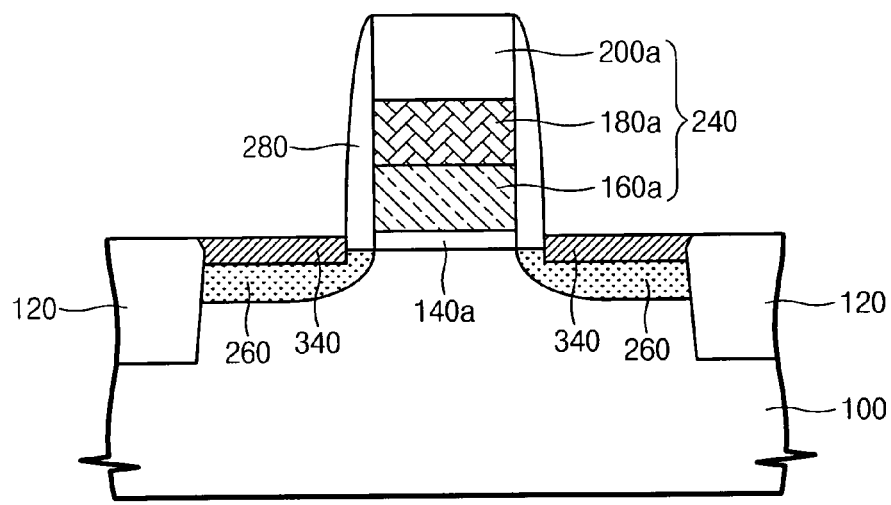

Referring to FIG. 12, the titanium nitride layer 320 and the non-reacting cobalt layer 300a are removed through a cleaning process. The cleaning process utilizes a cleaning solution comprising an acid solution and oxidation agent containing iodine. The cleaning solutions may be utilized for removing the photoresist pattern 220 that is mentioned above.

The acid solution includes sulfuric acid, phosphoric acid, or a mixture thereof. The oxidation agent containing iodine includes at least one of $KIO_3$, $NH_4IO_3$, $LiIO_3$, $CaIO_3$, $BaIO_3$, KI, $NH_4I$, etc. This is only an example and any other oxidation agent containing iodine can be utilized. The oxidation agent containing iodine removes the titanium nitride layer 320 and the non-reacting cobalt layer 340a but does not remove (or etch) a cobalt silicide layer 340 and a tungsten layer 180a that composes the gate electrode 240. This is, the oxidation agent containing iodine reacts with the silicon of the cobalt silicide layer to form a thin silicon oxide layer (SiOx) such as a silicon dioxide layer on the surface of the cobalt silicide layer as a passivation layer. In addition, the oxidation agent containing iodine reacts with tungsten to form a thin tungsten trioxide layer ($WO_3$) that is stable to the acid on the surface thereof, as a passivation layer.

The cleaning solution may include water. If the water is added to the cleaning solution, activated ions that participate in the removing reaction increase. In the exemplary embodiment, the cleaning solution contains water in an amount of about 30 wt % and less and the oxidation agent containing iodine in an amount of about 0.003 to about 10 wt %.

The cleaning time is inversely proportional to temperature. That is, the cleaning capacity is proportional to the temperature. The cleaning process may be carried out at about room temperature to about 120° C.

More specifically, the silicide thermal treatment will be explained hereinafter. First, a first thermal treatment is performed at a proper temperature. The first thermal treatment forms an intermediate state silicide layer that comprises stoichiometrically almost cobalt monosilicide (CoSi) and a little cobalt disilicide ($CoSi_2$). After the first thermal treatment, a first cleaning process is carried out using the cleaning solution so as to remove the non-reacting cobalt layer and the titanium nitride layer. A titanium nitride layer is formed again and then a second thermal treatment is performed at a proper temperature. The second thermal treatment forms a low resistive cobalt silicide layer 340 that contains stoichiometrically almost cobalt disilicide ($CoSi_2$). Finally, a second cleaning process is performed with the cleaning solution to remove the titanium nitride layer and the non-reacting cobalt layer.

Figure 13:
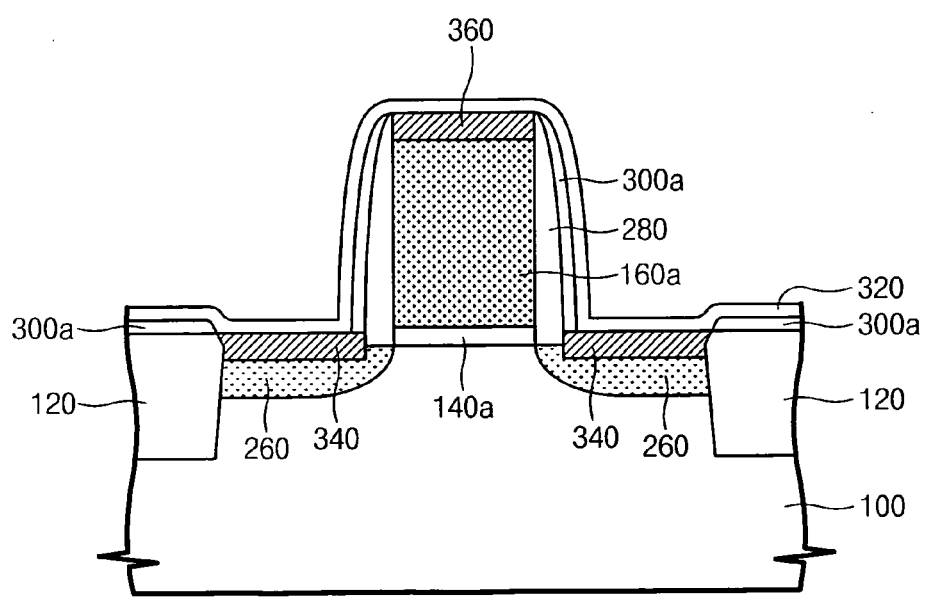
FIGS. 13 and 14 are cross-sectional views showing steps of selectively removing metal layers using a cleaning solution of the present invention in a silicidation process according to another exemplary embodiment.
Figure 14:
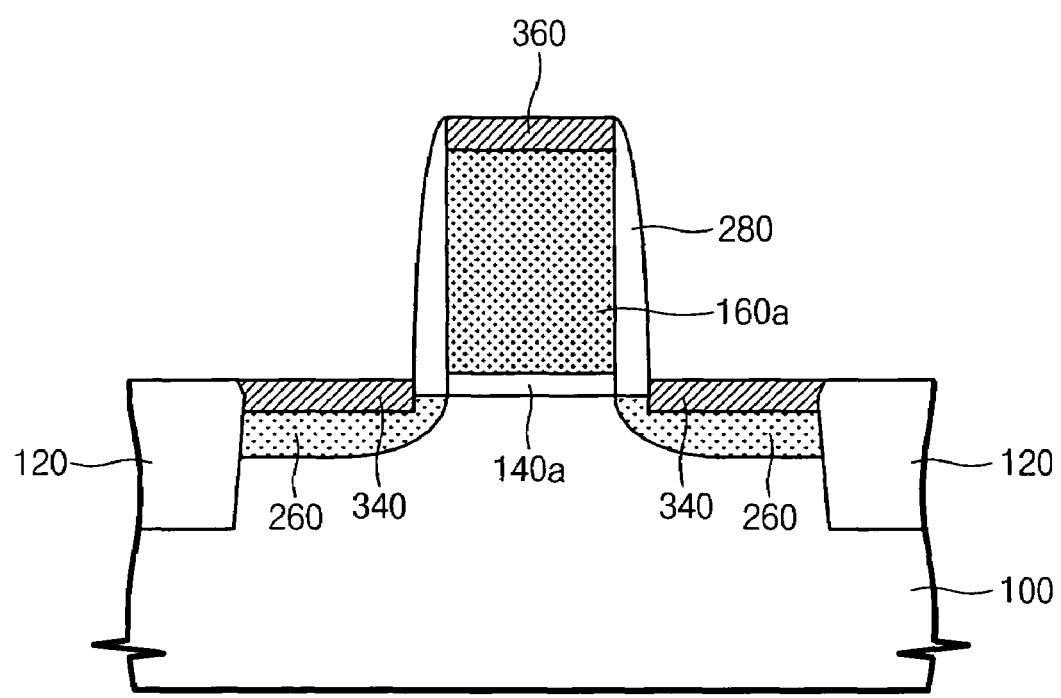

FIGS. 13 and 14 are cross-sectional views showing steps of removing undesired layers using the cleaning solution of the present invention in a silicidation process according to another exemplary embodiment. In contrast to the above methods, conductive material composing a gate electrode comprises only polysilicon. The gate electrode is employed in a dual gate technology that dopes impurities of which conductivity type is identical with that of a channel into the polysilicon composing a gate electrode. The dual gate has advantages that strengthen the surface function of the channel and makes a symmetric low-power operation.

Referring to FIG. 13, briefly explained, a well is formed in a silicon substrate 100 by an impurity doping. Then, a device isolation layer 120 is formed by a device isolation process and channel ions are implanted. A polysilicon gate electrode 160a is formed that is electrically insulated from the silicon substrate 100 by a gate insulation layer 140a. Continuously, using the polysilicon gate electrode 160a as an ion implantation mask, ions are implanted to form impurity diffusion layers 260. Sidewall spacers 280 are formed on sidewalls of the polysilicon gate electrode 160a.

Next, a silicidation process will be performed. A metal layer and a titanium nitride layer are formed so as to form silicide. The metal layer directly contacts with not only the impurity diffusion layers 260 but also the silicon of the upper part of the polysilicon gate 160a. A silicide thermal treatment is carried out to form metal silicide layers 340 and 360 on the impurity diffusion regions 260 and on the gate electrode 160a, respectively.

Referring to FIG. 14, the non-reacting metal layer 300a and a titanium nitride layer 320 are removed by the cleaning solution including the acid solution and the oxidation agent with iodine in the same manner as the method fully mentioned above.

According to embodiments of the present invention, using the cleaning solution, a non-reacting metal such as cobalt and titanium and the titanium nitride layer can be effectively removed in the silicidation process.

Moreover, the cleaning solution does not etch the tungsten layer, such that the tungsten gate process can be employed. Thus, device operation characteristics can be improved. Also, a photoresist layer and organic materials can be effectively removed.

While the present invention has been described in connection with specific and exemplary embodiments thereof, it is capable of various changes and modifications without departing from the spirit and scope of the invention. It should be appreciated that the scope of the invention is not limited to the detailed description of the invention hereinabove, which is intended merely to be illustrative, but rather comprehends the subject matter defined by the following claims. In addition, it should be construed to include all methods and devices that are in accordance with the claims.

What is claimed is:

1. A method of selectively removing a metal layer in a process for fabricating a semiconductor device, comprising:

removing the metal layer with a cleaning solution, the cleaning solution comprising an acid solution and an oxidation agent containing iodine, wherein the oxidation agent containing iodine includes at least one selected from the group consisting of $NH_4IO_3$, $LiIO_3$, $CaIO_3$, $BaIO_3$, KI, and $NH_4I$ wherein the cleaning solution further includes water.

2. The method of claim 1, wherein the metal layer comprises at least one of a titanium layer and a cobalt layer.

3. The method of claim 1, wherein the acid solution includes at least one of sulfuric acid and phosphoric acid.

4. The method of claim 1, wherein the cleaning solution includes water in an amount of about 30 wt % and less, and the oxidation agent containing iodine in an amount of about 0.003 to 10 wt %.

5. The method of claim 2, wherein the titanium layer comprises at least one of titanium nitride and titanium.

6. A method of selectively removing a metal layer in a process for forming a silicide layer comprising:
forming a silicon pattern over a substrate;
forming a metal layer over the substrate;
performing a silicide thermal treatment to form a metal silicide layer from silicidation reaction between the silicon and the metal layer;
cleaning a non-reacting metal layer that does not participate in the silicidation reaction using a cleaning solution,
wherein the cleaning solution includes an acid solution and an oxidation agent containing iodine.

7. The method of claim 6, wherein the metal layer includes at least one of cobalt, titanium, and nickel.

8. The method of claim 6, wherein the cleaning solution further includes water.

9. The method of claim 6, wherein the acid solution includes sulfuric acid and phosphoric acid, and the oxidation agent containing iodine includes at least one selected from the group consisting of $KIO_3$, $NH_4IO_3$, $LiIO_3$, $CaIO_3$, $BaIO_3$, $KI$, and $NH_4I$.

10. The method of claim 9, wherein the cleaning solution includes water in an amount of about 30 wt % and less, and the oxidation containing iodine in an amount of about 0.003 to about 10 wt %.

11. The method of claim 6, wherein the cleaning is performed at a temperature range of about room temperature to about 120° C.

12. The method of claim 6, further comprising step of:
sequentially performing a first treatment using a mixture of $NH_4OH$ and $H_2O_2$ and a second treatment using HF or sequentially performing a first treatment using a mixture gas of $CF_4$ and $O_2$ and a second treatment using HF before forming the metal layer, so as to remove a natural oxide layer and to cure damage to the substrate.

13. The method of claim 6, wherein the silicide thermal treatment comprises:
performing a first thermal treatment;
performing a first cleaning that removes the non-reacting metal layer using the cleaning solution; and
performing a second thermal treatment.

14. The method of claim 13, wherein the cleaning solution includes water in an amount of about 30 wt % and less, and the oxidation containing iodine in an amount of about 0.003 to about 10 wt %.

15. The method of claim 14, wherein the acid solution includes at least one of sulfuric acid and phosphoric acid, and the oxidation agent containing iodine includes at least one selected from the group consisting of $KIO_3$, $NH_4IO_3$, $LiIO_3$, $CaIO_3$, $BaIO_3$, $KI$, and $NH_4I$.

16. The method of claim 14, wherein the first cleaning is performed at a temperature range of about room temperature to about 120° C.

17. The method of claim 6, wherein the substrate further includes a tungsten layer, and the cleaning solution does not remove the tungsten layer.

18. The method of claim 6, further comprising:
forming a titanium nitride layer over the metal layer, after forming the metal layer and before performing the silicide thermal treatment,
wherein the cleaning solution removes the titanium nitride layer.

19. The method of claim 18, wherein the silicide thermal treatment comprises:
performing a first thermal treatment;
performing a first cleaning that removes the titanium nitride layer and the non-reacting metal layer using the cleaning solution;
forming a second titanium nitride layer; and
performing a second thermal treatment,
wherein the cleaning solution removes the further formed titanium nitride layer and the non-reacting metal layer.

20. A method of selectively removing a metal layer in a process for forming a silicide layer comprising:
forming a transistor comprising source/drain regions and a gate electrode over a silicon substrate;
forming a metal layer over the substrate;
forming a titanium nitride layer over the metal layer;
performing a thermal treatment to form a metal silicide layer from reaction between the silicon of the source/drain regions and the metal layer that directly contact the silicon; and
performing a cleaning that removes the titanium nitride layer and a non-reacting metal layer that does not directly contact the silicon of the source/drain regions, using a cleaning solution,
wherein the cleaning solution includes an acid solution, an oxidation agent containing iodine and water.

21. The method of claim 20, wherein the step of forming the transistor comprises:
forming a gate insulation layer, a polysilicon layer, a tungsten layer and a capping insulation layer over the silicon substrate;
forming a photoresist pattern over the capping insulation layer;
forming the gate electrode by successively etching the layer formed thereunder using the photoresist pattern as a mask;
removing the photoresist pattern;
performing an ion implantation process to form the source/drain regions in the silicon substrate at both sides of the gate electrode; and
forming nitride spacers on sidewalls of the gate electrode.

22. The method of claim 21, wherein the photoresist pattern is removed using the cleaning solution.

23. The method of claim 20, wherein the acid solution includes at least one of sulfuric acid and phosphoric acid, and the oxidation agent containing iodine includes at least one selected from the group consisting of $KIO_3$, $NH_4O_3$, $LiIO_3$, $CaIO_3$, $BaIO_3$, $KI$, and $NH_4I$, and the cleaning solution includes water in an amount of about 30 wt % and less and an oxidation agent containing iodine in an amount of about 0.003-about 10 wt %.

24. The method of claim 23, wherein the cleaning is performed at a temperature range of about room temperature to about 120° C.

25. The method of claim 24, wherein the metal layer includes at least one of cobalt, titanium, and nickel.

26. The method of claim 20, wherein the step of forming the transistor comprises:
sequentially forming a gate insulation layer and a polysilicon layer over the silicon substrate;
forming a photoresist pattern over the polysilicon layer;
forming the gate electrode by successively etching the layers formed thereunder using the photoresist pattern as an etch mask;

removing the photoresist pattern;

performing an ion implantation process to form the source/drain regions in the silicon substrate at both sides of the gate electrode; and forming nitride spacers on sidewalls of the gate electrode, wherein when the metal silicide layer is formed at the source/drain regions by performing the silicide thermal treatment, a metal silicide layer is formed on the polysilicon at an upper part of the gate electrode.

27. The method of claim 26, wherein the photoresist pattern is removed using the cleaning solution.

28. The method of claim 26, wherein the acid solution includes at least one of sulfuric acid and phosphoric acid, and the oxidation agent containing iodine includes at least one selected from the group consisting of $KIO_3$, $NH_4IO_3$, $LiI_3$, $CaIO_3$, $BaIO_3$, KI, and $NH_4I$, and the cleaning solution includes water in an amount of about 30 wt % and less and an oxidation agent containing iodine in an amount of about 0.003-about 10 wt %.

29. The method of claim 28, wherein the cleaning is performed at a temperature range of about room temperature to about 120° C.

30. The method of claim 6, wherein the oxidation agent containing iodine includes at least one selected from the group consisting of $NH_4IO_3$, $LiIO_3$, $CaIO_3$, $BaIO_3$, KI, and $NH_4I$, and the cleaning solution further includes water.

* * * * *